United States Patent [19]
Cazaux

[11] Patent Number: 4,862,274
[45] Date of Patent: Aug. 29, 1989

[54] PHOTOSENSOR WITH FRAME TRANSFER STRUCTURE AND ITS USE IN AN IMAGE SENSOR WITH REDUCED SMEARING EFFECT

[75] Inventor: Yvon Cazaux, Grenoble, France
[73] Assignee: Thomson-Csf, Paris, France
[21] Appl. No.: 197,997
[22] Filed: May 24, 1988
[30] Foreign Application Priority Data
   May 26, 1987 [FR] France ............................. 87 07419
[51] Int. Cl.$^4$ ............................................. H04N 3/14
[52] U.S. Cl. ........................... 358/213.24; 358/213.19; 358/213.31; 357/24
[58] Field of Search ...................... 358/213.24, 213.19, 358/213.25, 213.31; 357/24 LR

[56] References Cited
U.S. PATENT DOCUMENTS

| | | | |
|---|---|---|---|
| 4,032,976 | 6/1977 | Levine | 358/213.24 |
| 4,040,092 | 2/1977 | Carnes | 358/213.25 |
| 4,593,303 | 6/1986 | Dyck et al. | 357/24 LR |
| 4,654,683 | 3/1987 | Anagnostopoulos et al. | 357/24 LR |
| 4,717,945 | 1/1988 | Yusa et al. | 357/24 LR |
| 4,760,435 | 7/1988 | Burt | 357/24 LR |
| 4,782,394 | 11/1988 | Hieda | 358/213.19 |

FOREIGN PATENT DOCUMENTS
60-62154 10/1985 Japan.

Primary Examiner—Jin F. Ng
Assistant Examiner—Stephen Brinich
Attorney, Agent, or Firm—Roland Plottel

[57] ABSTRACT

In a photosensor with a frame transfer structure, each pixel constituting the matrix of photosensitive points is provided with a pulse-controlled MOS transistor. At the end of the frame transfer the TMOS is controlled through the electrodes, $V_{DA}$ and $V_{GA}$, to eliminate residual charges which are present in the photosensitive zone and which are due to the transfer of empty stages corresponding to the dark zones of the image in the stages under the illuminated zones.

8 Claims, 3 Drawing Sheets

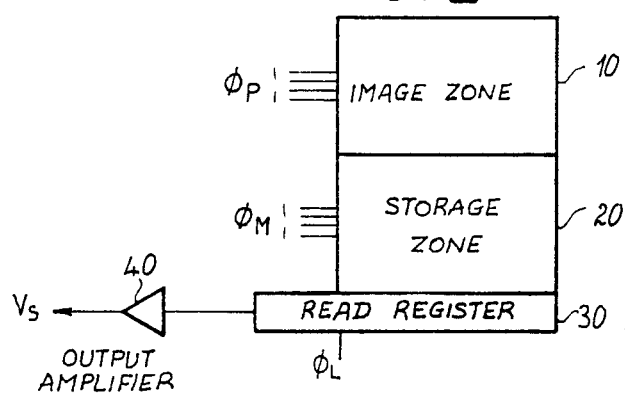
FIG_1
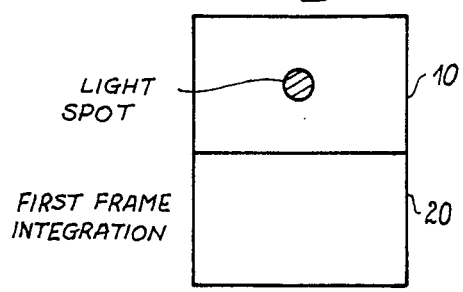
FIG_2a
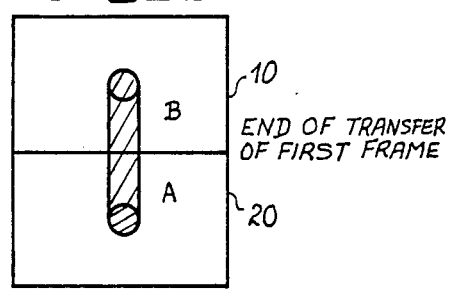
FIG_2b
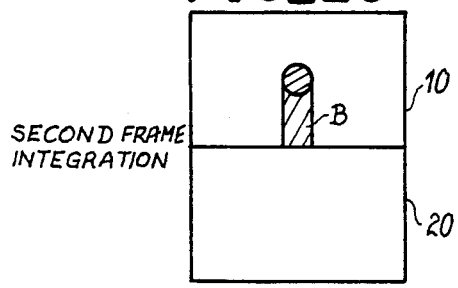
FIG_2c
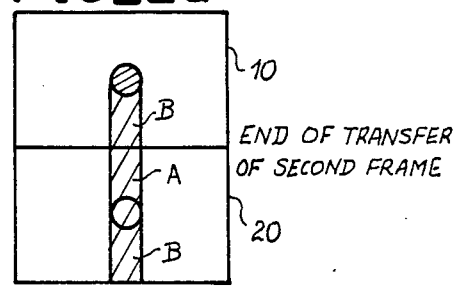
FIG_2d
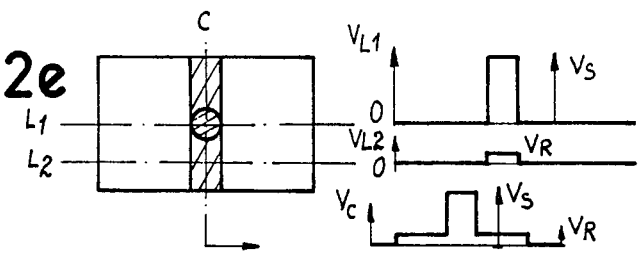
FIG_2e

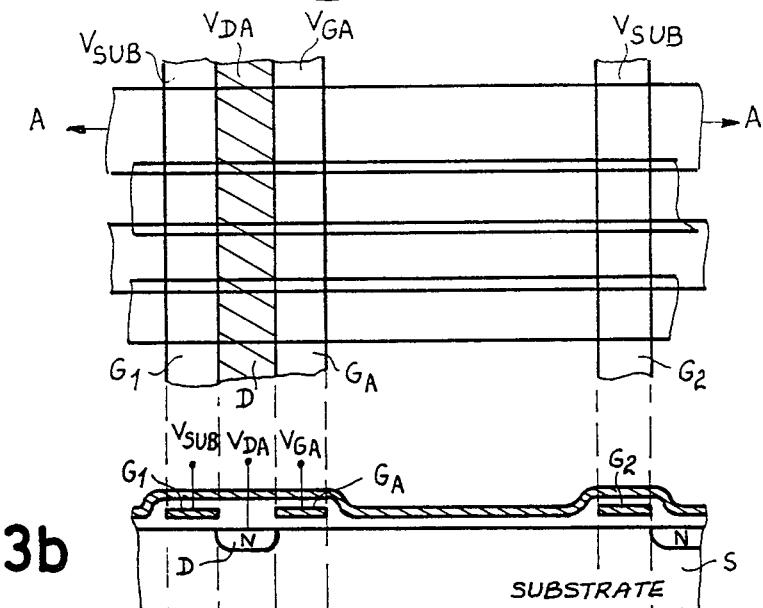
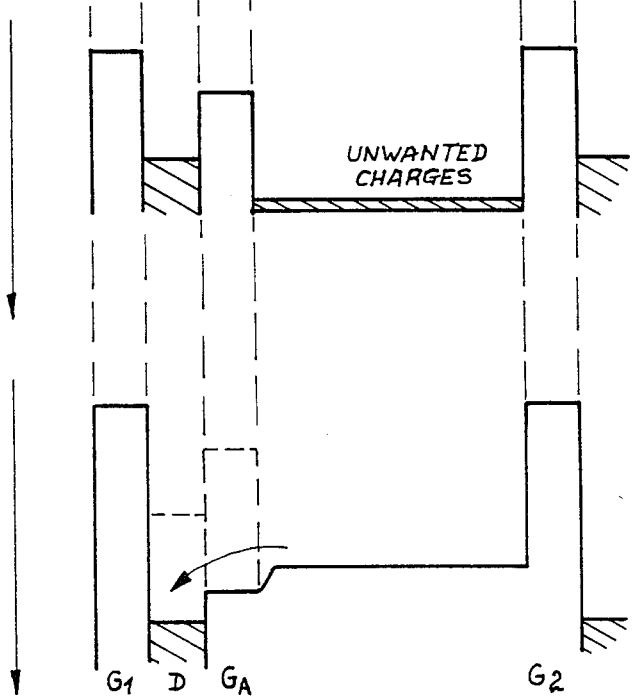

FIG_5
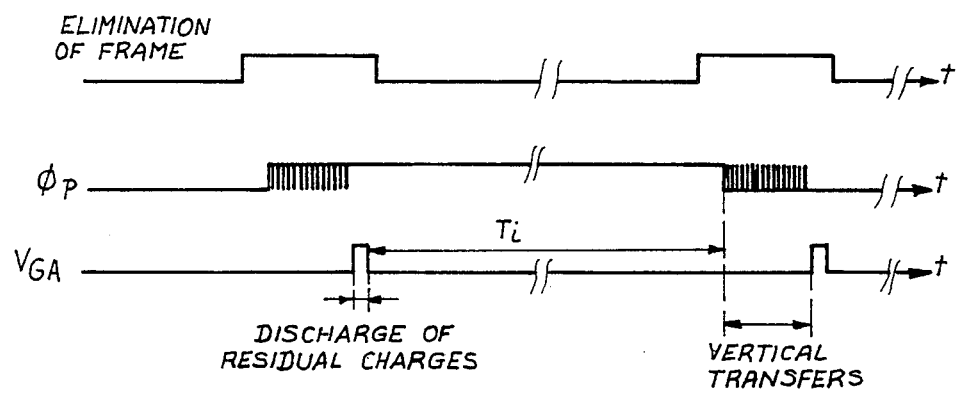
FIG_6
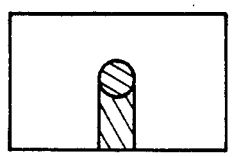

PHOTOSENSOR WITH FRAME TRANSFER STRUCTURE AND ITS USE IN AN IMAGE SENSOR WITH REDUCED SMEARING EFFECT

BACKGROUND OF THE INVENTION

1. Field of the Invention

The invention relates to solid state matrix photosensors and, especially, to an improvement as regards smearing effect in solid state matrix photosensors of the frame transfer type.

This smearing effect results in pollution, above and below the illuminated zones, in the video signal coming from the sensor. It constitutes one of the main drawbacks of the frame transfer structure.

2. Description of the Prior Art

This problem is conventionally resolved by either placing a shutter in front of the photosensitive zone to prevent any unwanted radiation during the transfer from the image zone to the storage zone, or increasing the vertical transfer frequency to restrict this effect, in proportion to the run time under an illuminated line during the vertical transfer.

The former approach is cumbersome while the latter is difficult to implement, especially for large-sized photosensors where the vertical transfer frequency cannot be increased sufficiently without lowering the quality of performance of the sensor.

An object of the invention is a frame transfer photosensor, which has a modified structure and which enables the elimination of the smearing effect above an illuminated zone in a dark background.

SUMMARY OF THE INVENTION

According to the invention, there is provided a photosensor with a frame transfer structure having an image zone, with vertical charge transfer registers and horizontal transfer control electrodes, a storage zone and an output register, wherein each photosite (or location of light corresponding to the pixel) of the photosensitive matrix, bounded by vertical insulating gates and localized beneath a horizontal control electrode, is provided with a device to discharge, in a short period of time, the unwanted charges which are present therein at the end of the frame transfer.

The invention can be applied especially to image sensors used for tracking, where the image consists mainly of an overbright spot on a continuous background.

Another object of the invention is the use of the photosensor, as defined above, in an image sensor with reduced smearing effect in one part of the image.

The invention will be better understood and other features will emerge from the following description, made with reference to the appended drawings.

BRIEF DESCRIPTION OF THE DRAWINGS

Of these drawings:

FIG. 1 gives a schematic view of the standard type of organization of the frame transfer photosensor.

FIGS. 2a, 2b, 2c and 2d illustrate the formation of the smearing effect, and FIG. 2e shows the resultant image for an illuminated spot on a dark background, and the corresponding signals for two lines and one column;

FIGS. 3a and 3b are detailed diagrams of a part of the image zone of a photosensor according to the invention, seen respectively in a plane view and in a sectional view along a line;

FIGS. 4a and 4b represent the configuration of the potential wells before and after application of a pulse which eliminates the residual smear for a pixel such as is shown in FIGS. 3a and 3b;

FIG. 5 is the timing diagram of the corresponding control signals;

FIG. 6 shows the image of an illuminated spot on a dark background, obtained by a photosensor according to the invention.

DETAILED DESCRIPTION OF THE PREFERRED EMBODIMENT

FIG. 1 represents the standard organization of a frame transfer photosensor.

The device consists chiefly of three sub-units:

These are the image zone 10 and its control electrodes $\phi_P$, the storage zone 20 and its control electrodes $\phi_M$, and the read register 30 and its read control electrodes $\phi_L$ and the output amplifier 40 which gives the video signal.

The following is the principle on which the photosensor works:

During the integration period Ti, the charges created by the incident photons are integrated in the image zone. The image zone consists of vertical charge transfer registers placed side by side and controlled simultaneously by the electrodes $\phi_P$.

At the end of integration, the information contained in the image zone is transferred to the storage zone.

The storage zone too consists of vertical charge transfer registers controlled by common electrodes $\phi_M$.

The transfer of the data contained in the image zone to the storage zone is achieved by simultaneously controlling the electrodes $\phi_P$ and $\phi_M$. This vertical transfer is done at the frequency $Fv = 1/Tv$. The period Tv corresponds to the time needed for a one-line shift.

When the transfer into the storage zone is completed, integration in the image zone starts again while the information contained in the storage zone is discharged, line by line, by the read register through control of the electrodes $\phi_M$ and $\phi_L$.

At the end of the integration, during the vertical transfer from the image zone to the storage zone, the pieces of information from the different lines are shifted while the incident illumination continues to generate information in the image zone.

This results in a mixture of information, integrated during the integration period Ti, with information gathered during the vertical transfer period.

The deterioration thus introduced into the video signal is called smearing.

It is proportionate to the vertical transfer period and to the number of lines illuminated.

FIGS. 2a, 2b, 2c and 2d use a simple example to explain the formation of deterioration in quality introduced by smearing effect for standard sensors, when the information consists of a single light spot extending over N lines.

FIG. 2a: at the instant to, a light spot is applied to the image zone 10 of the sensor which integrates it during the period Ti. The storage zone 20 is empty, the sensor being plunged into darkness before the instant to.

FIG. 2b: the signal present in the image zone 10 has just been transferred to the storage zone 20. The integration of a new frame begins.

Zones A and B correspond to the stages of the charge transfer registers which are polluted during transfers from the image zone 10 to the storage zone 20 by illumination which persists during the transfer.

FIG. 2c: the situation at the end of integration. The information from the previous frame, contained in the storage zone 20, has been discharged and this zone is empty.

FIG. 2d: configuration after transfer from the image zone to the storage zone. The signal in the storage zone contains the pollution in A and B.

This is also true for all the following frames.

FIG. 2e represents the smearing effect on the restored image in the same example. It implies smearing above and below the illuminated zone. This smearing corresponds to a constant level of residual voltage VR, whatever the line: it is proportionate to the run time of the empty stages beneath the illuminated zone, during the vertical transfers. The residual level $V_R$, due to the smearing effect, can be expressed as follows:

for illumination E lower than the photosensor saturating illumination Esat:

$$VR = N \cdot \frac{Tv}{Ti} \cdot Vs, \tag{1}$$

for illumination E greater than Esat:

$$VR = N \cdot \frac{TV}{Ti} \cdot Vsat \cdot \frac{E}{Esat} \tag{2}$$

with:

Vs: level of signal on pixels illuminated during Ti with illumination E;

Vsat: run time beneath an illuminated line;

Ti: integration period;

N: number of illuminated lines;

N.Tv: run time of empty stages beneath the light spot during the vertical transfers.

The video signals, $V_{L1}$ and $V_{L2}$, associated with two lines, $L_1$ and $L_2$, one chosen at the level of illuminated spot, and the other chosen at the level of zone subjected to smearing, and the signal $V_c$, corresponding to a column C, have been shown in FIG. 2e.

According to the expressions (1) and (2), raising the vertical transfer frequency enables a reduction in the residual level $V_R$ of smearing.

However, as indicated above, the raising of this frequency is limited because of the time constants distributed according to lines, which cause deterioration in the vertical resolution when the transfer frequency becomes too high. For a ⅔-inch sized sensor, the vertical transfer frequency can hardly exceed 1 to 2 MHz.

The residual voltage corresponding to the television mode, according to CCIR standards where the integration period Ti=20 ms, is equal, for 100 illuminated lines, to: $V_R = 5.10^{-3} Vs$. If the same lines are over-illuminated to 100 times the saturation level, the residual voltage in the presence of a anti-glare device becomes:

$$V_R = \frac{Vsat}{2}$$

For applications functioning outside CCIR standards, with far shorter integration times, the smearing time very soon becomes disadvantageous.

For example, for an integration Ti=1 ms, for N=100 lines illuminated at E<Esat, and with a vertical transfer frequency Fv=1 MHz: $V_R = 0.1 \cdot Vsat$.

If the same lines are over-illuminated to 100 times the saturation level, and with an anti-glare device, E=100 Esat and VR=Vsat.

Consequently, the entire zone located above and below the spot is saturated, and the anti-glare device becomes unnecessary.

The present invention proposes an approach by which it is possible to keep the zones located above the illuminated regions intact without any deterioration in the quality of electro-optical performance.

A MOS transistor is beside each pixel, as shown in FIGS. 3a and 3b, which respectively represent a photosite or elementary zone of the image zone 10, respectively in a plane view and in a cross-sectional view along the axis A of FIG. 3a. A MOS transistor is made between two vertical insulating gates, $G_1$ and $G_2$, which define a photosite and are given the potential of the substrate $V_{SUB}$ and the remaining zone demarcates the useful width of the vertical charge transfer register. For this, an N-doped diffusion zone D is made in the substrate S to constitute the drain of the transistor which is given the drain voltage $V_{DA}$, and a gate $G_A$, extending in a direction parallel to the insulating gates and forming the gate of the MOS transistor is deposited on the substrate. This gate is biased at the voltage $V_{GA}$. The entire unit is covered with horizontal control electrodes receiving the transfer control signals $\phi_P$ of the vertical charge transfer registers. The various levels, namely the substrate, vertical gates and horizontal gates are separated by oxide.

In most cases, the MOS transistors are depleted (buried-channel) transistors and the electrodes $G_A$ and D are controlled separately $V_{GA} \neq V_{DA}$.

In the case of enhanced transistors, the threshold voltage is positive and $V_{DA}$ and $V_{GA}$ may be connected together.

The application of a positive pulse to the controls of these transistors, at the start of the frame, eliminates the smearing located above the illuminate zones without affecting the useful signal.

For this, the amplitude of the pulse should be such that it enables the total discharge of the unwanted charges in the photosites at the end of vertical transfer, while the image zone 10 is completely emptied of its useful information.

FIGS. 4a and 4b show the configuration of the potential wells of a pixel polluted by unwanted illumination, before and after the application of this pulse.

That fact that, at the end of vertical transfer, the charges contained in the image zone are discharged into the drains of the above-described MOS transistors, enables the total removal of deterioration from the zone B, FIG. 2b. Since the image zone is emptied of useful information, this information is not affected by this pulse. Integration during the second frame thus takes place in the same circumstances as the first frame integration, without any residual smearing in the image zone. All that remains in the restored video signal is the smearing in the zones A, under the image of the illuminated spot. The timing diagram of the signals to be generated to make this improvement is shown in FIG. 3 which shows the frame elimination signal, the pulses for controlling transfers in the vertical charge transfer registers and the pulses for discharging residual charges in the image zone 10, applied to the gates of the MOS transistors.

According to the invention, the pulse duration is fixed: it may be very short and may be contained in the frame return time.

The low level of this pulse can be adjusted in order to obtain anti-glare protection against high illumination levels. The invention can be used to preserve low-level data while, at the same time, eliminating the smearing effect at the top of the image.

In the case of application to tracking, the image consists mainly of a spot on a continuous background.

The smearing is such that the object is lost in the smear, as shown in FIG. 2e.

FIG. 6 shows the resultant image obtained by a photosensor according to the invention under the same conditions of illumination as those defined above.

As this figure shows, the invention enables the locating of an object, even under conditions where the smearing is very great (at a level equal to the object). As a matter of fact, the object is located at the top of the smear.

In the case of standard images, the interference caused by the smearing effect is mainly localized in zones of very high intensity. The invention limits these problems to the bottom of the image, keeping information at the top of the image intact.

The invention relates to any frame transfer type of structure. It requires a device enabling the discharge of the charges contained in the pixel within a very short time.

It is independent of the mode of operation of the vertical charge transfer registers and that of the horizontal register.

What is claimed is:

1. A photosensor with a frame transfer structure comprising an image zone, provided with vertical charge transfer registers and transfer control electrodes, a storage zone and an output register, wherein each photosite of the photosensitive matrix, being bounded by vertical insulating gates and localized beneath a transfer control electrode, is provided with a device to discharge, in a short period of time, the unwanted charges which are present therein at the end of the frame transfer; and wherein the device to discharge the unwanted charges in each photosite comprises a MOS transistor, having insulating gates constituting a source, a doped zone of the substrate constituting a drain (D), and a control gate, said transistor receiving short control pulse at the end of the frame transfer, to discharge the charges towards the drain.

2. A photosensor according to claim 1 wherein, when the transistors are depleted, the drain and control gate receive different control voltages $V_{DA}$ and $V_{GA}$.

3. An image sensor according to claim 1 wherein said control pulse is of fixed amplitude and duration.

4. An image sensor according to claim 1 wherein said control pulse has an adjustable amplitude to obtain anti-glare protection against high illumination levels.

5. An image sensor according to claim 1 wherein said sensor comprising of at least 1 vertical or horizontal charge transfer register, and said device to discharge at the end of the frame transfer is independent of the mode of operation of said charge transfer register.

6. An image sensor with reduced smearing effect in one part of the image comprising photosensor with a frame transfer structure comprising an image zone, provided with vertical charge transfer registers and transfer control electrodes, a storage zone and an output register, wherein each photosite of the photosensitive matrix, being bounded by vertical insulating gates and localized beneath a transfer control electrode, is provided with a device to discharge, in a short period of time, the unwanted charges which are present therein at the end of the frame transfer; and wherein the device to discharge the unwanted charges in each photosite comprises a MOS transistor, having insulating gates constituting a source, a doped zone of the substrate constituting a drain (D), and a control gate, said transistor receiving a short control pulse at the end of the frame transfer, to discharge the charges towards the drain.

7. An image sensor used for tracking a target comprising photosensor with a frame transfer structure comprising an image zone, provided with vertical charge transfer registers and transfer control electrodes, a storage zone and an output register, wherein each phtosite of the photosensitive matrix, being bounded by vertical insulating gates and localized beneath a transfer control electrode, is provided with a device to discharge, in short period of time, the unwanted charges which are present therein at the end of the frame transfer; and wherein the device to discharge the unwanted charges in each photosite comprises a MOS transistor, having insulating gates constituting a source, a doped zone of the substrate constituting a drain (D), and a control gate, said transistor receiving a short control pulse at the end of the frame transfer, to discharge the charges towards the drain, wherein the image zone above the target is devoid of smearing effect.

8. A sensor according to claim 7 wherein the image is composed mainly of a bright spot on a continuous background.

* * * * *